United States Patent
Origasa et al.

(10) Patent No.: US 6,349,072 B1
(45) Date of Patent: Feb. 19, 2002

(54) RANDOM ACCESS MEMORY DEVICE

(75) Inventors: Kenichi Origasa; Kiyoto Oota; Tomonori Fujimoto, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/705,541

(22) Filed: Nov. 3, 2000

(30) Foreign Application Priority Data

Nov. 5, 1999 (JP) .......................................... 11-315383

(51) Int. Cl.[7] ................................................ G11C 8/00
(52) U.S. Cl. .............. 365/233; 365/189.05; 365/230.08
(58) Field of Search ................................ 365/203, 233, 365/189.04, 225.7, 239, 189.11, 230.08, 189.05

(56) References Cited

U.S. PATENT DOCUMENTS

| 5,083,296 A |   | 1/1992 | Hara et al. | |
| 5,251,176 A | * | 10/1993 | Komatsu | 365/222 |
| 5,666,324 A | * | 9/1997 | Kosugi et al. | 365/233 |
| 5,999,472 A | * | 12/1999 | Sakurai | 365/222 |
| 6,147,927 A | * | 11/2000 | Ooshi | 365/233 |

* cited by examiner

*Primary Examiner*—David Nelms
*Assistant Examiner*—Thong Le
(74) *Attorney, Agent, or Firm*—Pearne & Gordon LLP

(57) ABSTRACT

To realize a semiconductor memory which can be operated at a low frequency without reducing a data transfer rate, the semiconductor memory according to the invention is configured so that a series of operation can be finished in two clock cycles of row address strobe operation and column address strobe operation for operating DRAM. Timing for turning a sense amplifier activation signal SE at a high level after delay time determined by a first delay element since a leading edge of a clock pulse CLK that turns a row address strobe pulse (/RAS) at a low level and activating a sense amplifier sequence is generated. Also, timing for starting read operation and write operation since a leading edge of the clock pulse CLK at which a column address strobe pulse (/CAS) is turned at a low level, turning the sense amplifier activation signal SE at a low level, turning a bit line precharge signal EQPR at a high level and starting precharge operation when the termination of reading and writing is detected is acquired.

9 Claims, 10 Drawing Sheets

READING

WRITEING

RANDOM ACCESS MEMORY DEVICE

BACKGROUND OF THE INVENTION

1. Field of the Invention

The present invention relates to a semiconductor memory, particularly relates to a dynamic random access semiconductor memory (DRAM) in which a row address and a column address can be latched by a 2-cycle clock signal using a relatively low-speed clock frequency and which enables paging operation.

2. Description of the Related Art

Dynamic RAM (DRAM) which is one of semiconductor memories writes or reads information depending upon whether electric charge is stored in a capacitor or not and has a problem that as electric charge gradually decreases after writing. Therefore, refresh, that is, the operation of reading information and rewriting it is required every a few millisecond and a circuit is complex.

Referring to the drawings, an example of the circuit operation of conventional type DRAM will be described below. In this example, DRAM is composed of MOSFET as a switching transistor and a capacitor. The gate electrode on MOSFET is connected to a word line, one of the source and the drain is connected to a bit line, the other i s connected to one electrode of the capacitor and electric charge in the capacitor is detected by a sense amplifier by controlling the potential of the word line and the bit line in synchronization with a clock pulse.

FIGS. 11A and 11B are timing charts showing the input/output of data to/from conventional type DRAM disclosed in JP-A-11-149767, FIG. 11A shows read operation and FIG. 11B shows write operation. As shown in FIG. 11A, in read operation, first, a circuit for a row address which is in a precharge state is activated by turning /RAS (a row address strobe) which is a second clock pulse to a trailing edge at the leading edge of CLK which is a first clock pulse, storage operation is started and a row address is latched. Hereby, a memory cell connected to a selected word line is activated and a sense amplifier connected to a selected bit line pair is activated.

Next, read operation is started by turning /CAS (a column address strobe) which is a third clock pulse to a trailing edge at the next leading edge of CLK which is the first clock pulse and a column address is latched. At this time, potential difference read in a bit line pair to which a selected memory cell is connected is amplified by turning a write enable signal /WE at a high level and disabling writing, effective data is determined and is further output to an external device via a read amplifier and others. Further, a circuit for a row address is turned in a precharge state by turning /RAS and /CAS at a high level at the next leading edge of CLK which is the first clock pulse and the next operation gets ready.

In the meantime, as shown in FIG. 11B, in write operation, /RAS is also similarly turned to a trailing edge at the leading edge of CLK which is the first clock pulse and a row address is latched. Hereby, a memory cell connected to a selected work line is activated and a sense amplifier connected to a selected bit line pair is activated. /CAS is turned to a trailing edge at the next leading edge of CLK which is the second clock pulse and a column address is latched. At this time, a write enable signal /WE is turned at a low level, write operation is enabled and effective data to be stored in a selected memory cell is input from a write amplifier and others. Further, a circuit for a row address is turned in a precharge state by turning /RAS and /CAS at a high level at the next leading edge of CLK which is the first clock pulse and the next operation gets ready.

In this specification, a mark added before a signal name, "/" denotes inversion and denotes a signal turned in an active state when the signal is at a low level (low active).

However, as such conventional type DRAM requires three cycles of RAS, CAS and a precharge cycle in reading and writing, a high operating frequency is required and power consumption is increased. Particularly, in case the operating frequency of DRAM determines the frequency of a system, a problem occurs.

SUMMARY OF THE INVENTION

The invention is made to solve the problems of the conventional type and realizes a semiconductor memory that can be operated at a low frequency without lowering data transfer rate.

To achieve the object, the invention is configured so that a series of operation can be completed by two clock pulses of a row address strobe and a column address strobe for operating DRAM.

Concretely, a semiconductor memory according to the invention provided with a memory cell array including plural memory cells, plural word lines selected according to a row address signal from an external device, plural bit lines selectively activated according to plural column address signals from the external device and a sense amplifier that amplifies data read every plural bit lines is characterized in that row address latch means that latches a row address signal corresponding to the activated state of a first control signal triggering a first edge of a clock pulse, sense amplifier activation means that activates the sense amplifier after a predetermined period determined by internal circuit operation since the first edge elapses corresponding to the activated state of the first control signal, column address latch means that latches a column address signal according to the activated state of a second control signal and precharge signal generation means that generates a precharge signal for precharging the bit Line after the predetermined period determined by the internal circuit operation since a second edge according to the activated state of the second control signal are provided.

As a second aspect of the invention, a semiconductor memory according to a first aspect is characterized in that the first and second edges mean edges where a clock pulse is turned from a first level to a second level, a clock pulse and first and second control signals are respectively input from an external device and control means that determines a state of a writing control signal for controlling whether data is written in the memory cell or not triggering the second edge, enables write operation in case the result of the determination is in a first state and enables read operation in case the result of the determination is in a second state different from the first state is provided.

As a third aspect of the invention, a semiconductor memory according to the first aspect is characterized in that timing control means that determines a state of the first control signal triggering the second edge, disables page mode operation in case the result of the determination is in the first state, enables precharge in the bit line in a clock cycle including the second edge to get ready for the next operation, enables page mode operation in case the result of the determination is in the second state different from the first state and disables precharge in the bit line in the clock cycle including the second edge is provided.

As a fourth aspect of the invention, a semiconductor memory according to the first aspect is characterized in that the first and second edges are edges where a clock pulse is turned from the first level to the second level, a function for setting a third control signal to the first state triggering the second edge and setting the third control signal to a second state different from the first state when read operation or write operation is finished is provided and precharge in the bit line is started after a predetermined period since the third control signal is set to the second state.

As a fifth aspect of the invention, a semiconductor memory according to the fourth aspect is characterized in that further, plural read/write amplifiers arranged between the sense amplifier and a data input/output circuit that read/write data from the sense amplifier and a column control circuit that controls the read/write amplifier are provided, the column control circuit generates a read/write amplifier control signal for controlling the operation of the read/write amplifier according to the activated state of a second control signal triggering the second edge, the read/write amplifier control signal is returned to the column control circuit via the read/write amplifier that receives a signal latest of the plural read/write amplifiers and a third control signal is set to the second state according to the read/write amplifier control signal returned to the column control circuit.

As a sixth aspect of the invention, a semiconductor memory according to the first aspect is characterized in that further, an internal clock for activating the sense amplifier, a first internal clock generator that turns the internal clock in a predetermined state triggering a first edge of a clock pulse corresponding to the activated state of a first control signal after a predetermined period elapses since the first edge and a second internal clock generator that latches the first control signal in synchronization with the clock pulse are provided, the first internal clock generator is connected to the internal clock via a first fuse element, the second internal clock generator is connected to the internal clock via a second fuse element and the first fuse element or the second fuse element can be disconnected during the manufacturing process or after the manufacture if necessary.

As a seventh aspect of the invention, a semiconductor memory according to the sixth aspect is characterized in that a connected state of the first fuse element or the second fuse element is determined by an option of a lithographic mask used in a wiring process.

DETAILED DESCRIPTION OF THE PREFERRED EMBODIMENTS

Figure 1:
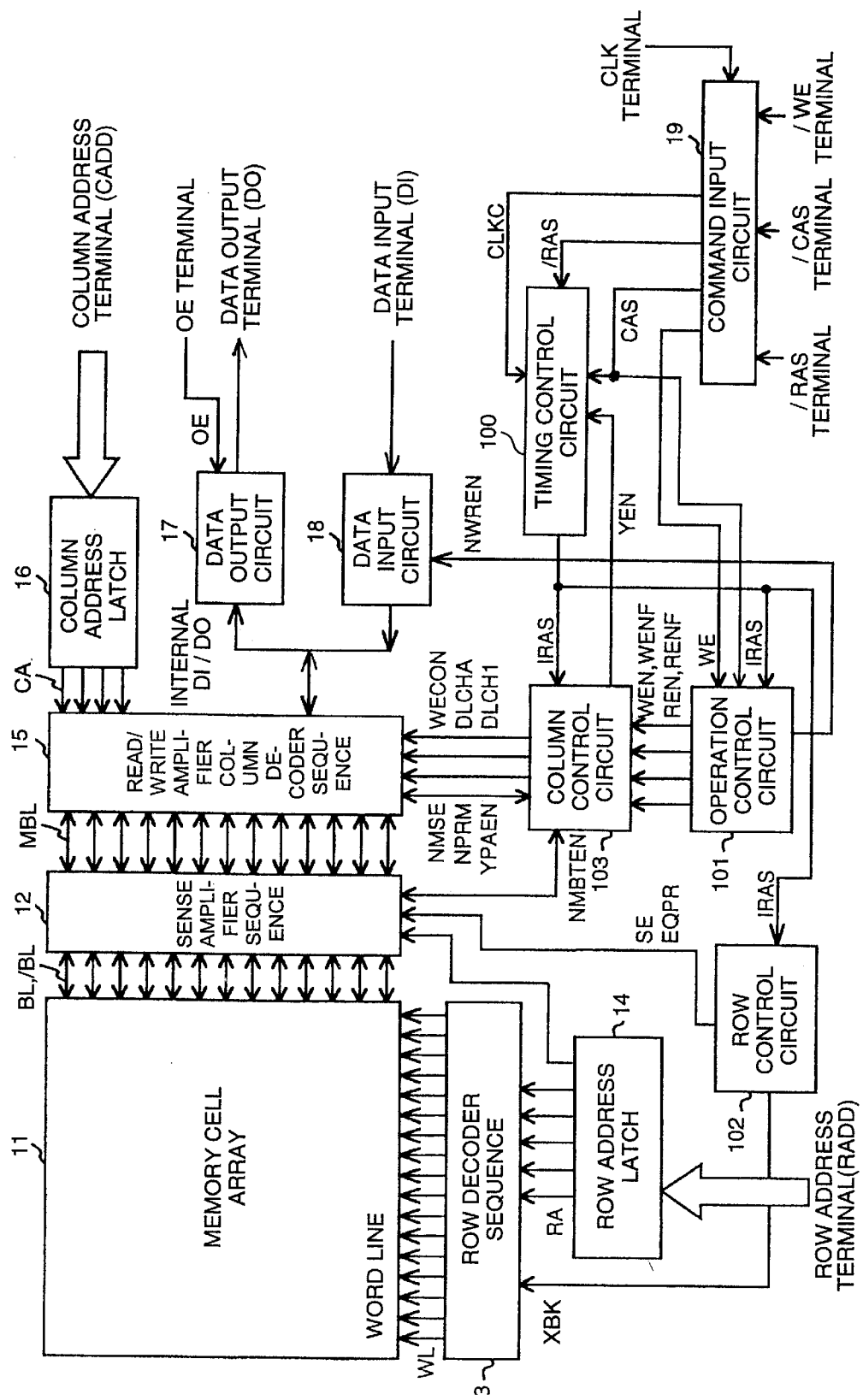
FIG. 1 is a functional block diagram showing a semiconductor memory equivalent to one embodiment of the invention.

Next, one embodiment of the invention will be described below referring to the drawings.

FIG. 1 shows the functional block configuration of a semiconductor memory equivalent to one embodiment of the invention. As shown in FIG. 1, a memory cell array 11 including plural memory cells (not shown) that respectively store data, word lines WL connected to the memory cell array 11 such as 32 blocks each of which is composed of 256 lines are arranged, 1024 bit line pairs BL and /BL connected to the memory cell array 11 for example and a sense amplifier sequence 12 each of which is provided every bit line pair BL, /BL, which amplifies the minute potential of a memory cell from which data is read and determines a data value are arranged.

For a circuit for a row address, a row decoder sequence 13 each of which is provided every word line WL for selecting a word line WL according to an internal row address signal RA is connected to each word line WL and a row address latch circuit 14 for latching a row address signal RADD from a row address terminal and outputting it to the row decoder sequence 13 is connected to the row decoder sequence 13.

Also, for a circuit for a column address, the sense amplifier sequence 12 is connected to each bit line pair BL, /BL, and the sense amplifier sequence 12 and a read/write amplifier column decoder sequence 15 are connected via a main data line MBL. The read/write amplifier column decoder sequence 15 has a function for connecting to a predetermined sense amplifier based upon an internal column address signal CA. A column address latch circuit 16 for latching a column address signal CADD from a column address terminal and outputting it to the read/write amplifier column decoder sequence 15 is connected to the read/write column decoder sequence 15. The row address terminal and the column address terminal may be also a common terminal.

A data output circuit 17 and a data input circuit 18 are connected to the read/write amplifier column decoder sequence 15 respectively via internal DI/DO, in read operation, internal data read in the data output circuit 17 via the read/write amplifier column decoder sequence 15 is output to a data output terminal as data output signal DO and in write operation, the data input circuit 18 outputs a data input signal DI input from a data input terminal to the read/write amplifier column decoder sequence 15. The data input terminal and the data output terminal may be also a common terminal. In the read/write amplifier column decoder sequence 15, plural write amplifiers, plural read amplifiers, a first group of plural data latch circuits connected to the plural read amplifiers and further, a second group of data latch circuits that latches the output of the first group of data latch circuits are included. The output of the second group of data latch circuits is input to the internal DO. The internal DI is connected to the write amplifier.

Also, an output enable signal OE from an OE terminal is input to the data output terminal as data output disable means.

An external clock (CLK) terminal which is an external control terminal, a row address strobe (/RAS) terminal, a column address strobe (/CAS) terminal and a write enable (/WE) terminal are connected to a command input circuit 19, and an internal clock pulse CLKC which is an internal control signal, an internal row address strobe pulse /RAS, an internal column address strobe pulse CAS and an internal write enable signal WE are output.

Further, as the characteristic of this embodiment, a timing control circuit 100 that outputs various control signals for regulating the read operation and the write operation of the memory, an operation control circuit 101, a row control circuit 102 and a column control circuit 103 are provided.

The internal clock pulse CLKC, the internal row address strobe pulse /RAS and the internal column address strobe pulse CAS respectively output from the command input circuit 19 are input to the timing control circuit 100, and an internal operation timing control clock pulse IRAS which is an enable signal of the row operation of DRAM is output.

The internal write enable signal WE output from the command input circuit 19 and the internal operation timing control clock pulse IRAS output from the timing control circuit 100 are input to the operation control circuit 101, a read operation flag RENF and a reading control signal REN are output for read operation, a write operation flag WENF and a writing control signal WEN are output for write operation and an input data fetching flag NWREN is output to the data input circuit 18.

The internal operation timing control clock pulse IRAS output from the timing control circuit 100 is input to the row control circuit 102, a sense amplifier activation signal SE and a bit line precharge signal EQPR are output to the sense amplifier sequence 12 and a word line block activation signal XBK is output to the row decoder sequence 13.

The internal operation Liming control clock pulse IRAS output from the timing control circuit 100 is input to the column control circuit 103, the read operation flag RENF, the reading control signal REN, the write operation flag WENF and a writing control signal WEN respectively output from the operation control circuit 101 are input to the column control circuit 103, and a write amplifier activation signal WECON, output data latch signals DLCHA and DLCH1, a read amplifier activation signal /MSE, a main data line precharge signal/PRM and a column connection enable signal YPAEN for connecting a column decoder sequence and a main data line MBL are output to the read/write amplifier column decoder sequence 15. Of these, the read amplifier activation signal /MSE, the main data line precharge signal /PRM, the column connection enable signal YPAEN are transmitted in the read/write amplifier column decoder sequence 15 for the control of timing and are input again to the column control circuit 103 from the farthest point. Also, a sense amplifier selection enable signal /MBTEN is output to the sense amplifier sequence 12. Also, a column operation flag YEN is returned to the timing control circuit 100. The output data latch signal DLCHA is a latch control signal of the first group of data latch circuits and the output data latch signal DLCH1 is a latch control signal of the second group of data latch circuits.

Figure 2:
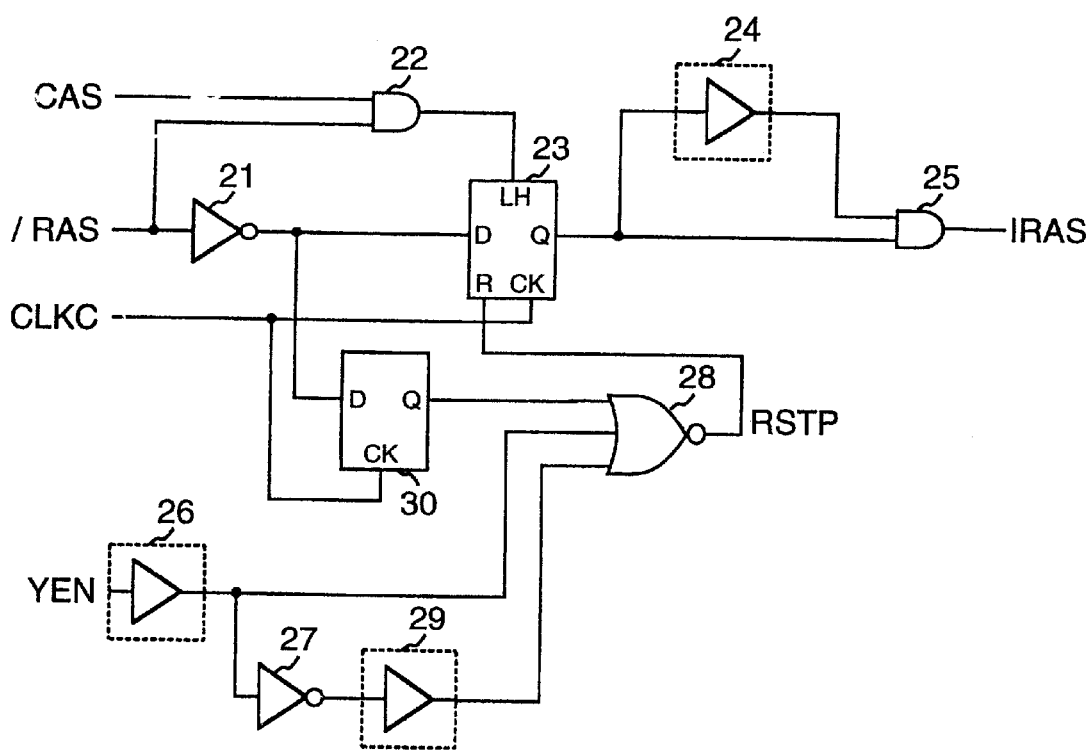
FIG. 2 is a circuit diagram showing a timing control circuit in the semiconductor memory equivalent to one embodiment of the invention.

FIG. 2 shows an example of the circuit configuration of the timing control circuit 100 in this embodiment.

As shown in FIG. 2, the internal clock pulse CLKC, the internal row address strobe pulse /RAS and the internal column address strobe pulse CAS are input to the timing control circuit 100, the internal row address strobe pulse /RAS is input to a first inverter element 21 and the output of the first inverter element 21 is input to a first delay (D) bistable circuit 23. The first D flip-flop 23 is provided with a load hold reset function that data can be fetched when a load hold (LH) terminal is at a low level and fetching data is disabled when the load hold terminal is at a high level. The internal clock pulse CLKC is input to the clock (CK) terminal of the first D flip-flop 23 and data is latched in synchronization with the leading edge of the internal clock pulse CLKC. The load hold terminal of the first D flip-flop 23 is connected to the output terminal of a first AND element 22, and the internal row address strobe pulse /RAS and the internal column address strobe pulse CAS are input to the input terminal of the first AND element 22. RSTP of an IRAS reset signal is input to the reset (R) terminal of the first D flip-flop 23.

To delay the leading edge of output from the first D flip-flop 23 by a predetermined delay period, the input terminal of a first delay element 24 and the input terminal of a second AND element 25 that outputs the internal operation timing control clock pulse IRAS are connected to the output terminal. The output terminal of the delay element 24 is connected to the other input terminal of the second AND element 25.

The column operation flag YEN is input to the timing control circuit 100. The column operation flag YEN is input to a second delay element 26 and the output terminal of the second delay element 26 is connected to the input terminal of a second inverter element 27 and the input terminal of a first NOR element 28. The output terminal of the second inverter element 27 is connected to the input terminal of a third delay element 29 and the output terminal of the third delay element 29 is connected to the input terminal of the first NOR element 28. The output terminal of a second D flip-flop 30 synchronized with the clock pulse is further connected to the input terminal of the first NOR element 28. The output terminal of the first inverter element 21 is connected to the D terminal of the second D flip-flop 30 and the internal clock pulse CLKC is input to the CK terminal.

Figure 3:
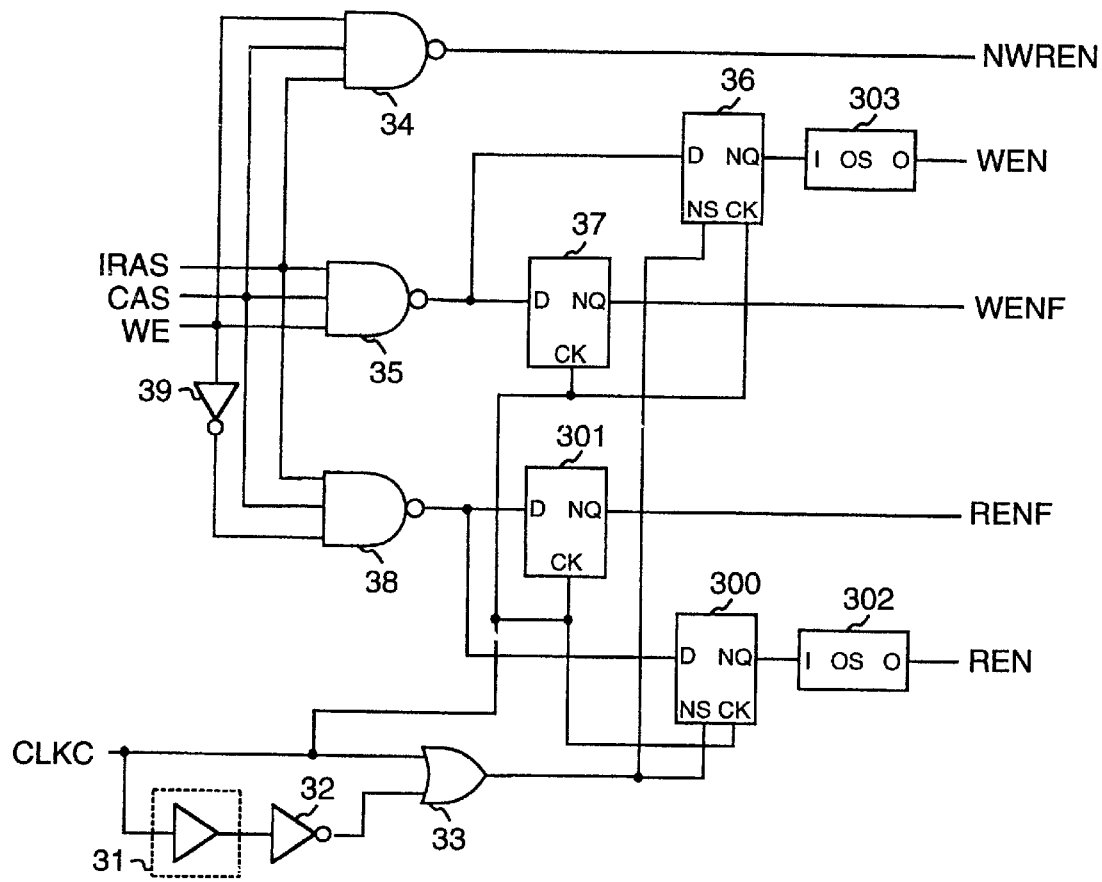
FIG. 3 is a circuit diagram showing an operation control circuit in the semiconductor memory equivalent to one embodiment of the invention.

FIG. 3 shows an example of the circuit configuration of the operation control circuit 101 in this embodiment.

As shown in FIG. 3, the internal clock pulse CLKC, the internal column address strobe pulse CAS, the internal operation timing control clock pulse IRAS and the internal write enable signal WE are input to the operation control circuit 101. A reset circuit for resetting the reading control signal REN and the writing control signal WEN respectively output by the operation control circuit 21 is included. The reset circuit is composed of a fourth delay element 31, a third inverter element 32 and a first OR element 33, the internal clock pulse CLKC is input to the fourth delay element 31 and the first OR element 33, the output of the fourth delay element 31 is input to the third inverter 32 and the output of the third inverter 32 is input to the first OR element 33. The input data fetching flag NWREN is output from the output terminal of a first NAND element 34, and the internal column address strobe pulse CAS, the internal operation timing control clock pulse IRAS and the internal write enable signal WE are input to the three input terminals. The internal column address strobe pulse CAS, the internal operation timing control clock pulse IRAS and the internal write enable signal WE are input to the three input terminals of the second NAND element 35 and the output terminal is connected a third D flip-flop 36 and a fourth D flip-flop 37. The third D flip-flop 36 is synchronous type flip-flop provided with a low active setting function and when the NS terminal is at a low level, the NQ terminal is turned at a low level independent of the clock pulse. Data is fetched in synchronization with a leading edge at the CK terminal. The NQ terminal is a terminal that outputs a pulse 180° out of phase with the D terminal in synchronization with a leading edge at the CK terminal. The NQ terminal of the third D flip-flop 36 is connected to the input terminal of a first one-shot circuit 303, the internal clock pulse CLKC is input to the CK terminal and the NS terminal is connected to the output terminal of the first OR element 33. The fourth D flip-flop 37 is synchronous type flip-flop and data is fetched in synchronization with a leading edge at the CK terminal. The write operation flag WENF is output from the NQ terminal of the fourth D flip-flop 37 and the internal clock pulse CLKC is input to the CK terminal. The internal column address strobe pulse CAS and the internal operation timing control clock pulse IRAS are input to the two input terminals of the third NAND element 38, the internal write enable signal WE is input to the input terminal via a fourth inverter element 39 and the output terminal is connected to a fifth D flip-flop 300 and a sixth D flip-flop 301. The fifth, D flip-flop 300 is provided with a function similar to that of the third D flip-flop 36. The NQ terminal of the fifth D flip-flop 300 is connected to the input terminal of a second one-shot circuit 302, the internal clock pulse CLKC is input to the CK terminal and the NS terminal is connected to the output terminal of the first OR element 33. The sixth D flip-flop 301 is synchronous type flip-flop and data is fetched in synchronization with a leading edge at the CK terminal. The read operation flag RENF is output from the NQ terminal of the sixth D flip-flop 301 and the internal clock pulse CLKC is input to the CK terminal. The writing control signal WEN is output from the output terminal of the one-shot circuit 303. The reading control signal REN is output from the output terminal of the second one-shot circuit 302.

Figure 4:
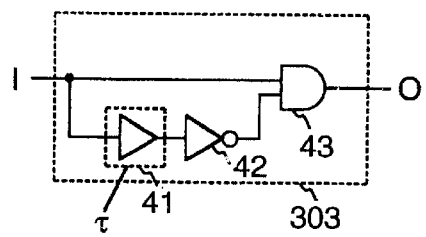
FIG. 4 is a circuit diagram showing a one-shot circuit in the semiconductor memory equivalent to one embodiment of the invention.

FIG. 4 shows an example of the circuit configuration of the first one-shot circuit 303.

As shown in FIG. 4, the first one-shot circuit 303 is composed of a fifth delay element 41, a fifth inverter element 42 and a third AND element 43. The input terminal I is connected to each input terminal of the fifth delay element 41 and the third AND element 43 and the output terminal of the fifth delay element 41 is connected to the input terminal of the fifth inverter element 42. The output terminal of the fifth inverter element 42 is connected to the input terminal of the third AND element 43 and the output terminal of the third AND element 43 functions as the output terminal O of the first one-shot circuit 303. The first one-shot circuit 303 has circuit configuration for generating a pulse including delay time τ since a leading edge at the input terminal I determined by the fifth delay element 41.

The one-shot circuit shown in this specification such as the second one-shot circuit has the similar configuration to the circuit shown in FIG. 4 and delay time τ is set according to the purpose.

Figure 5:
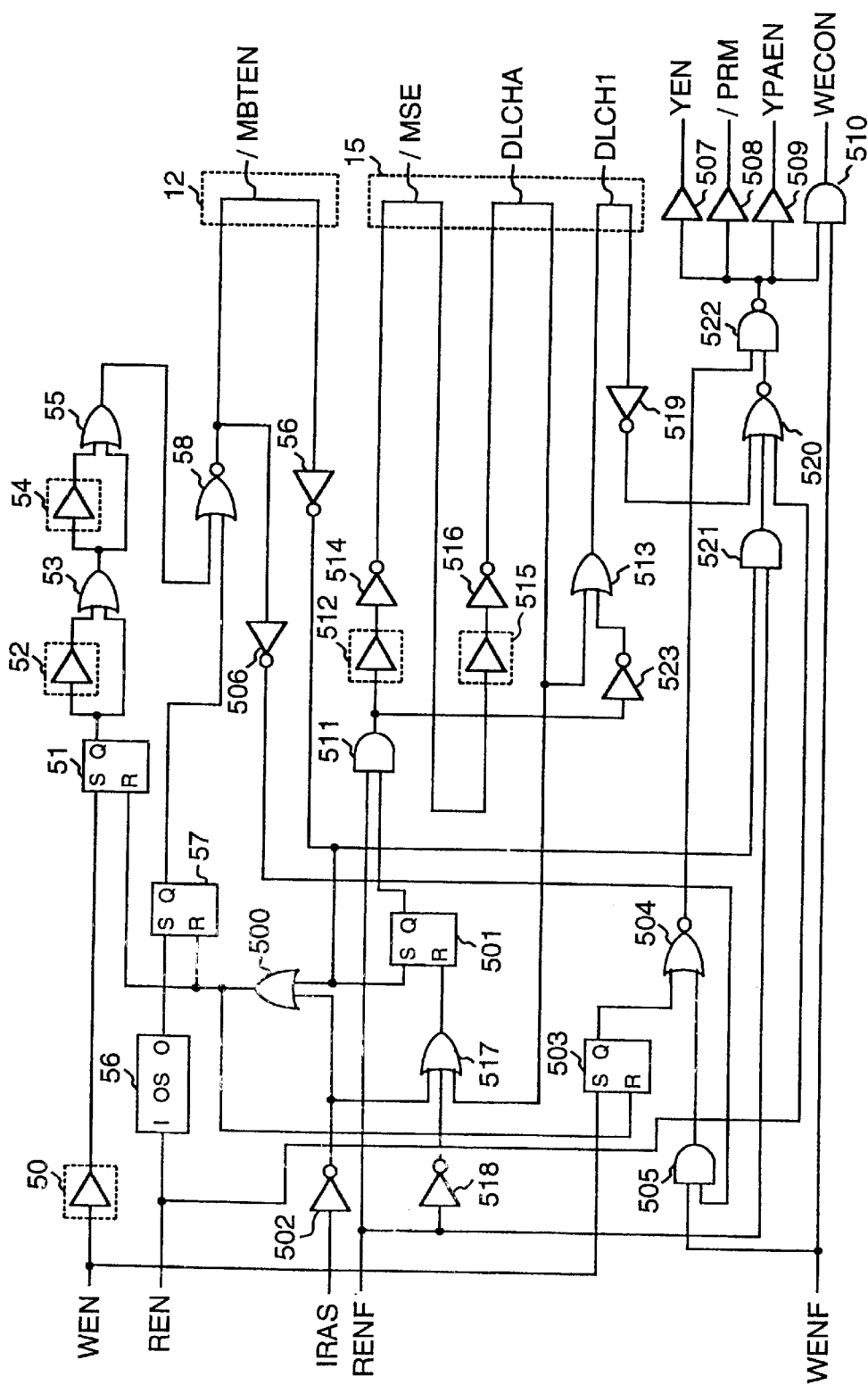
FIG. 5 is a circuit diagram showing a column control circuit in the semiconductor memory equivalent to one embodiment of the invention.

FIG. 5 shows an example of the circuit configuration of the column control circuit 103 in this embodiment.

As shown in FIG. 5, the read operation flag RENF, the reading control signal REN, the write operation flag WENF, the writing control signal WEN and the internal operation timing control clock pulse IRAS are input to the column control circuit 103. The reading control signal WEN is input to a sixth delay element 50 and the output terminal of the sixth delay element 50 is connected to the setting (S) input terminal of a first setting reset bistable circuit (hereinafter called an SR bistable circuit) 51. The output terminal Q of the first SR bistable circuit is connected to each input terminal of the seventh delay element 52 and a second OR element 53. Also, the output of the seventh delay element 52 is input OR the second OR element 53. Further, the output of the second OR element 53 is input to an eighth delay element 54 and a third OR element 55. The output of the eighth delay element 54 is input to the third OR element 55. The reading control signal REN is input to a third one-shot circuit 56. The output of the third one-shot circuit 56 is input to the S input terminal of a second SR bistable circuit 57.

Each output of the third OR element 55 and the second SR bistable circuit 57 is input to a second NOR element 58. A sense amplifier selection enable signal /MBTEN is output from the second NOR element 58. The sense amplifier selection enable signal /MBTEN is input to the sense amplifier sequence 12 and functions as an enable signal to a switching transistor (not shown) of a gate connecting a sense amplifier and the main data line MBL. This signal is transmitted in the sense amplifier sequence 12 and is input again to the column control circuit 103 shown in FIG. 5.

The sense amplifier selection enable signal /MBTEN input again is input to a sixth inverter element 59 and the output is input to a fourth OR element 500 and the S input terminal of a third SR bistable circuit 501. The internal operation timing control clock pulse IRAS is further input to the fourth OR element 500 via a seventh inverter element 502 and the output is input to the first SR bistable circuit 51, the second SR bistable circuit 57 and the reset (R) terminal of a fourth SR bistable circuit 503. The writing control signal WEN is input to the S terminal of the fourth SR bistable circuit 503 and the output terminal Q is connected to the input terminal of a third NOR element 504. The write operation flag WENF is input to a fourth AND element 505, the sense amplifier selection enable signal /MBTEN is input to the fourth AND element 505 via an eighth inverter element 506 and the output is input to the third NOR element 504. The output of the third NOR element 504 is input to a fourth NAND element 522. The output of the fourth NAND element 522 is input to buffer elements 507, 508 and 509. The column operation flag YEN is output from the buffer element 507, a main data line precharge signal /PRM is output from the buffer element 508 and a column connection enable signal YPAEN is output from the buffer element 509. A write amplifier activation signal WECON which is the output of the fourth NAND element 506 is further input to a fifth AND element 510 and the write operation flag WENF is input to the other input terminal of the fifth AND element.

The read operation flag RENF and the output Q of the third SR bistable circuit 501 are input to a sixth AND element 511 and the output terminal is connected to a ninth delay element 512 and a fifth OR element 513 via a ninth inverter element 523. The output of the ninth delay element 512 is input to a tenth inverter element 514. The output of the tenth inverter element 514 is input to the read/write amplifier column decoder sequence 15 as the read amplifier activation signal /MSE. After the input, the read amplifier activation signal /MSE is transmitted in the read/write amplifier column decoder sequence 15 and is input again to the column control circuit 103 shown in FIG. 5. The read amplifier activation signal /MSE input again is input to a tenth delay element 515 and the output of the tenth delay element 515 is input to an eleventh inverter element 516. The output of the eleventh inverter element 516 is input to the read/write amplifier column decoder sequence 15 as the output data latch signal DLCHA. After the input, the output data latch signal DLCHA is transmitted in the read/write amplifier column decoder sequence 15 and is input again to the column control circuit 103 shown in FIG. 5. The output data latch signal DLCHA input again is input to the fifth OR element 513 and a sixth OR element 517. The read operation flag RENF and the output of the seventh inverter element 502 are further input to the sixth OR element 517 via a twelfth inverter element 518. The output data latch signal DLCH1 is output from the fifth OR element 513 and is input to the read/write amplifier column decoder sequence 15. After the input, the output data latch signal DLCH1 is transmitted in the read/write amplifier column decoder sequence 15 and is input again to the column control circuit 103 shown in FIG. 5. The output data latch signal DLCH1 input again is input to a thirteenth inverter element 519. The output of the thirteenth inverter element 519 is input to a fourth NOR element 520. The reading control signal REN and the output of a seventh AND element 521 are further input to the input terminal of the fourth NOR element 520. The output of the fourth NOR element 520 is input to the fourth NAND element 522. The read operation flag RENF and the output of the sixth inverter element 59 are input to the seventh AND element 521.

Figure 6:
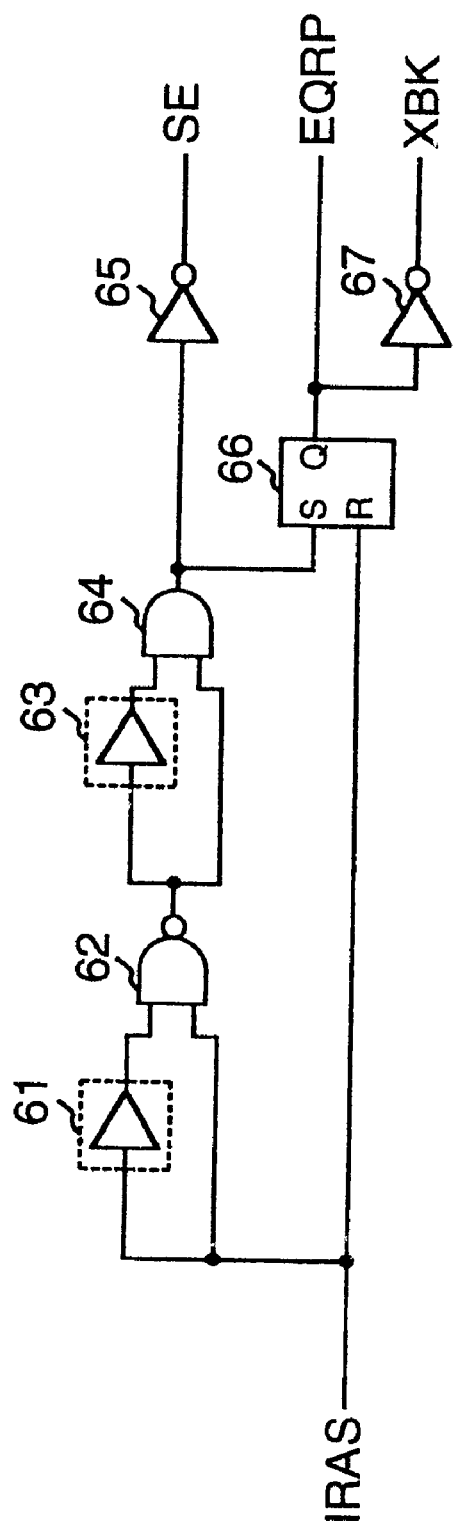
FIG. 6 is a circuit diagram showing a row control circuit in the semiconductor memory equivalent to one embodiment of the invention.

FIG. 6 shows an example of the circuit configuration of the row control circuit 102 according to the invention.

The internal operation timing control clock pulse IRAS is input to an eleventh delay element 61 and a fifth NAND element 62, and the output of the eleventh delay element 61 is input to the fifth NAND element 62. Further, the output of the fifth NAND element 62 is input to a twelfth delay element 63 and an eighth AND element 64, and the output of the twelfth delay element 63 is input to the eighth AND element 64. The output of the eighth AND element 64 is input to the setting (S) terminal of a fifth SR bistable circuit 66 and the internal operation timing control clock pulse IRAS is input to the reset (R) terminal. The output of the fourth SR bistable circuit 66 functions as a bit line precharge signal EQPR. Further, the output functions as a word line block activation signal XBK via a fourteenth inverter element 67. The output of the eighth AND element 64 functions as the sense amplifier activation signal SE via a fifteenth inverter element 65.

Figure 7:
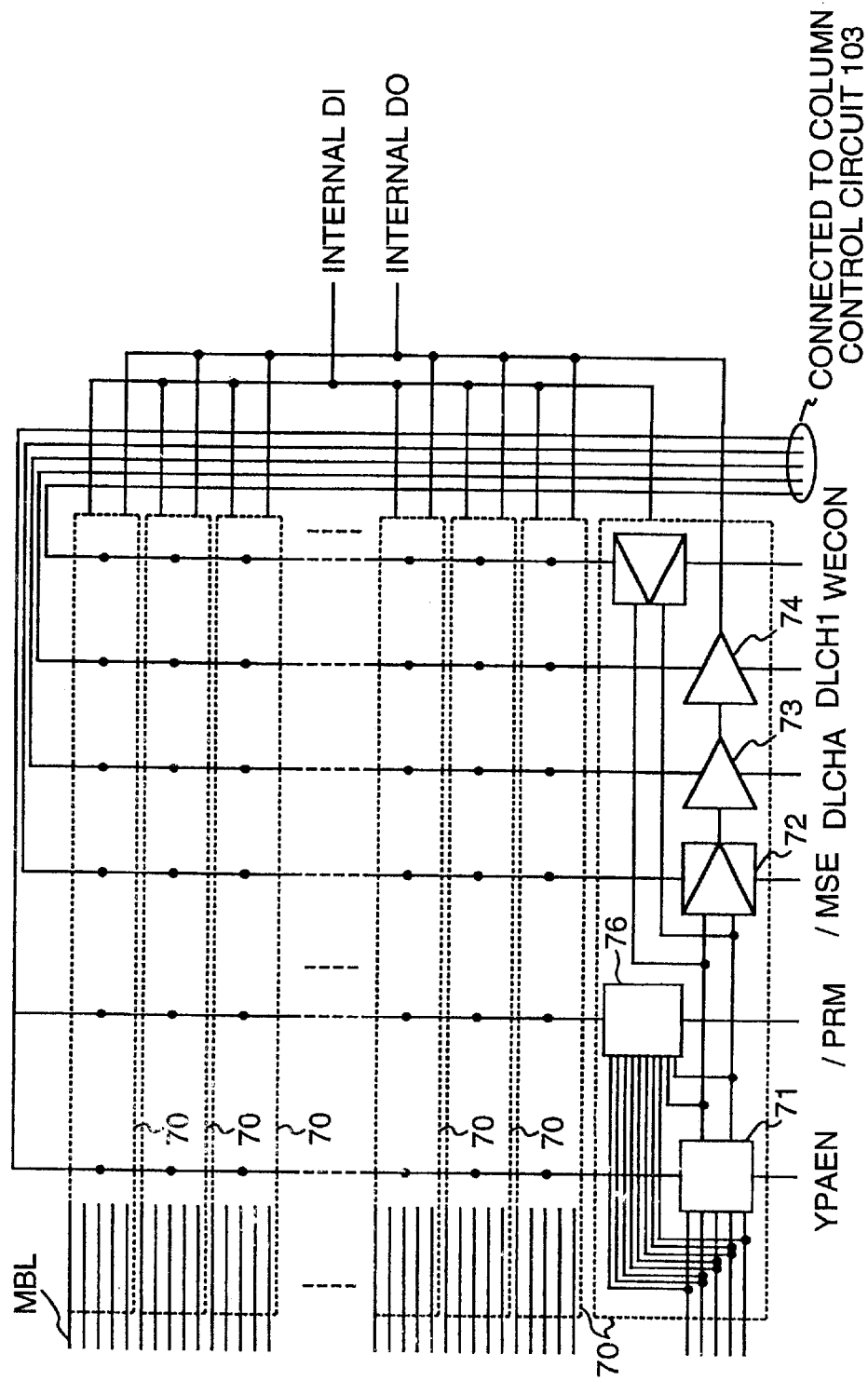
FIG. 7 shows the internal block configuration of a read/write amplifier column decoder array in the semiconductor memory equivalent to one embodiment of the invention.

FIG. 7 shows the internal block configuration of the read/write amplifier column decoder sequence 15 according to the invention.

In the read/write amplifier column decoder sequence 15, plural column unit blocks 70 are arranged. A reference number 71 denotes a column decoder, 72 denotes a read amplifier, 73 denotes the first group of data latch circuits, 74 denotes the second group of data latch circuits, 75 denotes a write amplifier and 76 denotes a main data line precharge circuit.

The column decoder 71 is connected to main data lines MBL and is connected to the read amplifier 72 and the write amplifier 75, and the column connection enable signal YPAEN has a function for selectively connecting the main data lines MBL, the read amplifier 72 and the write amplifier 75 when the signal is at a high level. The output terminal of the read amplifier is connected to the first group or data latch circuits 73 and further, the output of the first group of data latch circuits 73 is input to the second group of data latch circuits 74. An internal data input signal is input to the input terminal of the write amplifier via the internal DI and the internal DO for an internal data output signal is connected to the output terminal of the second group of data latch circuits 74. The first group of data latch circuits 73 and the second group of data latch circuits 74 have a function to store data when a control signal is at a high level and to output input data when the signal is at a low level. A main data line precharge circuit 76 has a function to precharge the main data line up to a predetermined level when the main data line precharge signal /PRM is at a low level.

The column connection enable signal YPAEN is input to all the column decoders 71 and is returned to the column control circuit 103 from the farthest part. When data is returned to the column control circuit 103 owing to such configuration, all the column decoders 71 are in a predetermined operational state.

Similarly, the read amplifier activation signal /MSE is input to all the read amplifiers 72 and is returned to the column control circuit 103 from the farthest part. When data is returned to the column control circuit 103 owing to such configuration, all the read amplifiers 72 are in a predetermined operational state.

Similarly, the output data latch signal DLCHA is input to all the first groups of data latch circuits 73 and is returned to the column control circuit 103 from the farthest part. When data is returned to the column control circuit 103 owing to such configuration, all the first groups of data latch circuits 73 are in a predetermined operational state.

Similarly, the output data latch signal DLCHA is input to all the second groups of data latch circuits 74 and is returned to the column control circuit 103 from the farthest part. When data is returned to the column control circuit 103 owing to such configuration, all the first groups of data latch circuits 74 are in a predetermined operational state.

Similarly, the write amplifier activation signal WECON is input to all the write amplifiers 75 and is returned to the column control circuit 103 from the farthest part. When data is returned to the column control circuit 103 owing to such configuration, all the write amplifiers 75 are in a predetermined operational state.

The operational timing of the semiconductor memory configured as described above will be described below.

Figure 8:
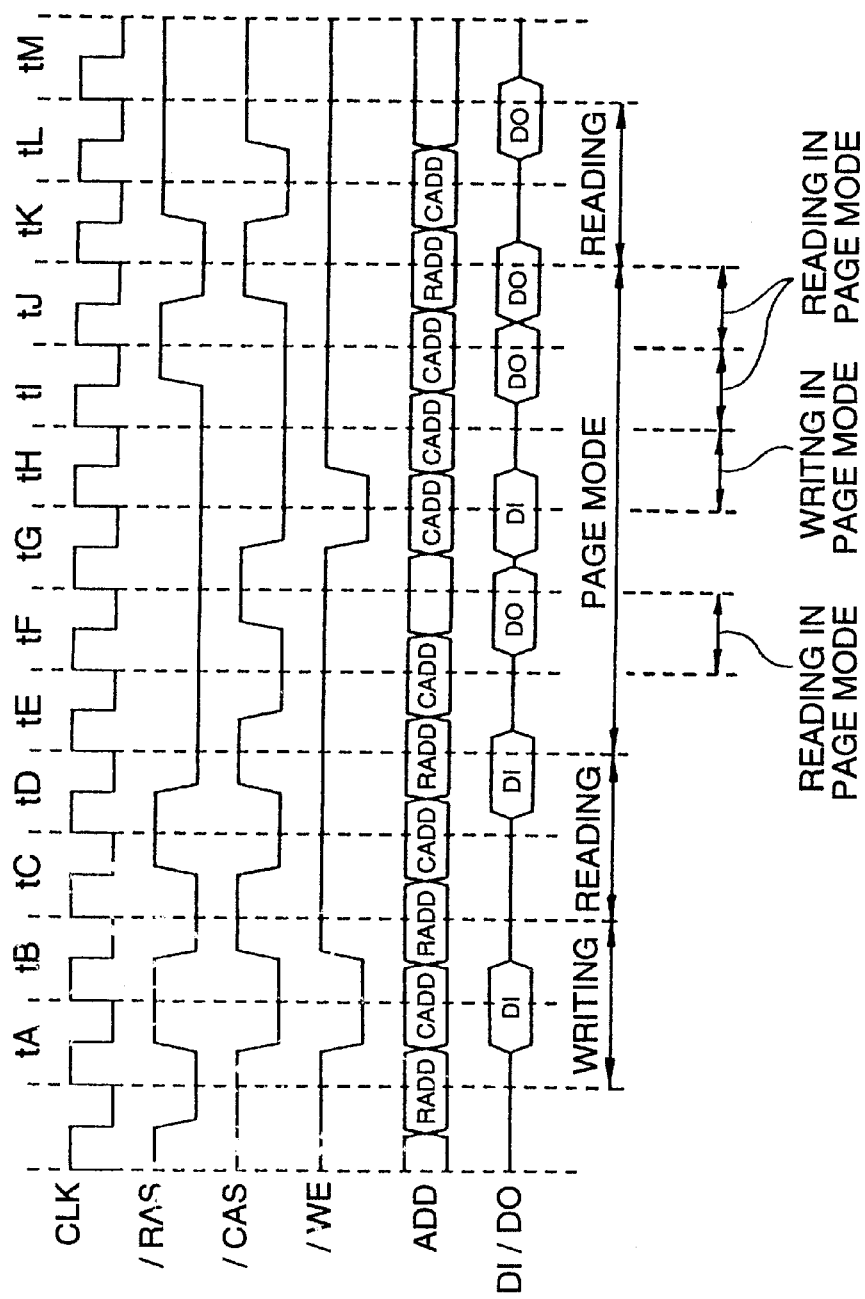
FIG. 8 is a timing chart showing writing/reading/page mode operation in the semiconductor memory equivalent to one embodiment of the invention.

FIG. 8 shows the operational timing of the semiconductor memory according to the invention. Before the detailed internal operation is described, the timing of an input signal of each operation will be described below.

An input waveform applied to the CLK terminal, the /RAS terminal, the /CAS terminal and the /WE terminal which are respectively the external control terminal of the command input circuit 19 is shown. Also, ADD denotes an address terminal in case a signal from the row address terminal RADD and the column address terminal CADD is input in a multiplexer mode. DI/DO denotes an input/output waveform of a data input signal DI and a data output signal DO. "tA to tL" show timing delimited by a leading edge of a waveform input to the clock terminal.

Timing tA and tB show normal write operation. Row selection operation is executed by turning the /RAS terminal at a low level, turning the /CAS terminal at a high level and inputting a row address to the row address terminal RADD respectively at the leading edge of the clock pulse in the timing tA. Column selection operation and write operation are executed by turning the /RAS terminal at a high level, turning the /CAS terminal at a low level, turning the /WE terminal at a low level, inputting a column address to the column address terminal CADD and inputting a write data input signal DI to a data input terminal respectively at a leading edge of the clock pulse in the next timing tB, and afterward, precharge operation is executed.

Also, timing tC and tD and tK and tL show normal read operation. Row selection operation is executed by turning the /RAS terminal at a low level, turning the /CAS terminal at a high level and inputting a row address to the row address terminal RADD respectively at a leading edge of the clock pulse in the timing tC. Column selection operation and read operation are executed by turning the /RAS terminal at a high level, turning the /CAS terminal at a low level, turning the /WE terminal at a high level and inputting a column address to the column address terminal CADD respectively at a leading edge of the clock pulse in the next timing tD, and afterward, bit line precharge operation is executed. A read data output signal DO is output to a data output terminal.

As described above, the semiconductor memory according to the invention can complete read operation and write operation in two cycles of a clock pulse CLK.

Timing tE to tJ show page mode operation in which writing and reading are mixed. Row selection operation is executed by turning the /RAS terminal at a low level, turning the /CAS terminal at a high level and inputting a row address to the row address terminal RADD respectively at a leading edge of the clock pulse in the timing tE. The next timing tF is the timing of page reading, column selection operation and write operation are executed by keeping the /RAS terminal at a low level, turning the /CAS terminal at a low level, turning the /WE terminal at a high level and inputting a column address to the column address terminal CADD respectively at a leading edge of the clock pulse and a read data output signal DO is output to the data output terminal. At this time, bit line precharge operation is not executed. The next timing tG is a dummy cycle for reading a page and at a leading edge of the clock pulse, the /RAS terminal is kept at a low level and the /CAS terminal is turned at a high level. The next timing tH is a cycle for writing a page and column selection operation and write operation are executed by keeping the /RAS terminal at a low level, turning the /CAS terminal at a low level, turning the /WE terminal at a low level, inputting a column address to the column address terminal CADD and inputting a write data input signal DI to the data input terminal respectively at a leading edge of the clock pulse. The next timing tI is timing for reading a page and processing is executed as in the timing tF. The further next timing tJ is timing for tF page reading. As shown in the timing, page operation is finished by turning the /RAS terminal at a high level at a leading edge of the clock pulse.

The timing of an internal circuit in each operation of the semiconductor memory configured as described above will be described below.

Figure 9:
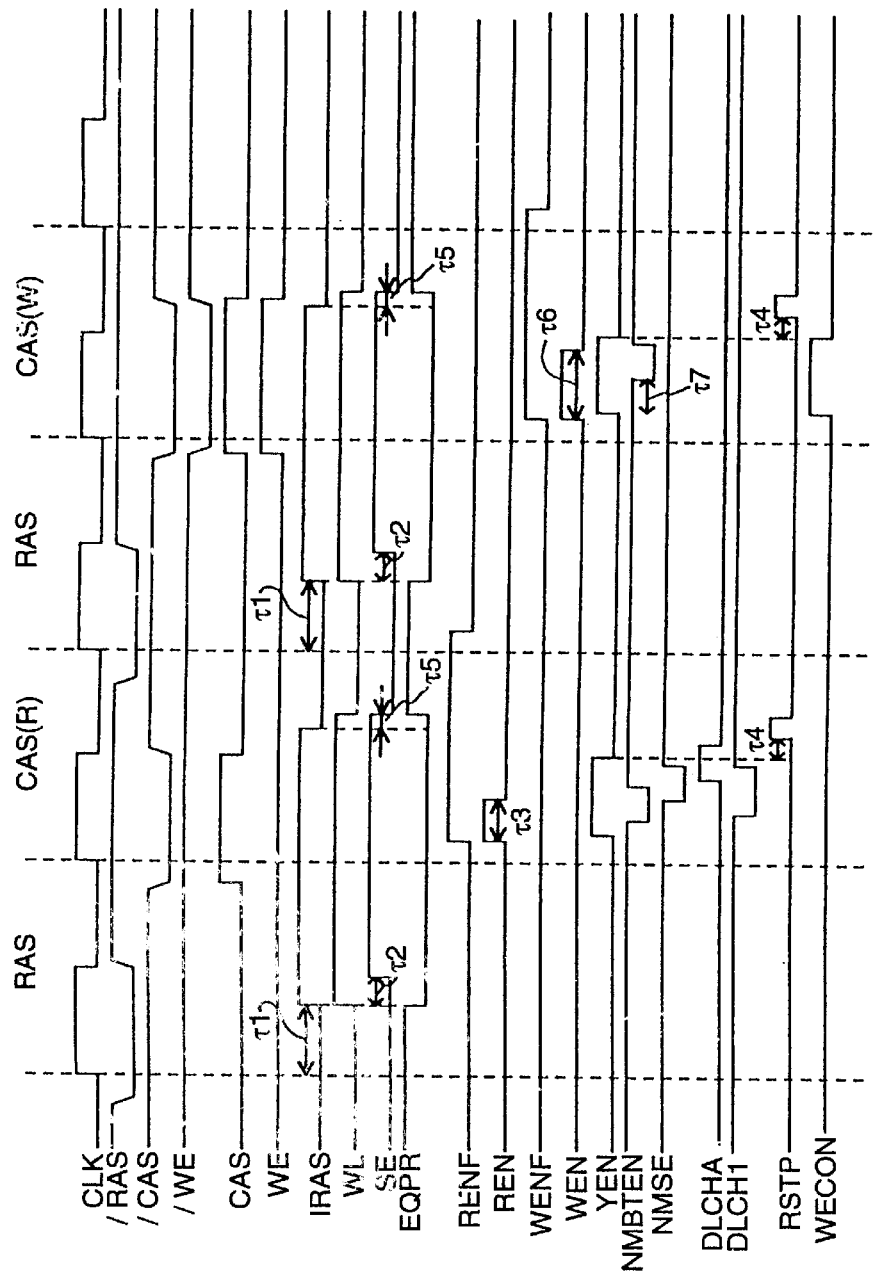
FIG. 9 is an internal timing chart in write/read operation in the semiconductor memory equivalent to one embodiment of the invention.

FIG. 9 is a timing chart showing normal write operation and read operation in the semiconductor memory in this embodiment.

First, referring to FIGS. 1 to 9, read operation will be described.

As shown in the timing chart shown in FIG. 9, in read operation, the /RAS terminal is turned at a low level before a leading edge of the clock pulse CLK. A signal input to the /RAS terminal is input to the command control circuit 19 and is output as the internal row address strobe pulse /RAS. At this time, the /CAS terminal connected to the command control circuit 19 is turned at a high level. The timing of one clock cycle in which the /RAS terminal is turned at a low level and the /CAS terminal is turned at a high level respectively at a leading edge of the clock pulse CLK is called RAS timing.

As input to the first NOR element 28 is all at a low level till the RAS timing, the R terminal of the first delay (D) bistable circuit 23 is a high level and is in a reset state and a signal at a low level is output from the Q terminal. Therefore, the internal operation timing control clock pulse IRAS is at a low level, therefore, the S terminal of the fifth SR bistable circuit 66 is at a high level, a word line block activation signal XBK is at a low level, the word line WL is in an inactive state, the sense amplifier activation signal SE is at a low level, a bit line precharge signal EQPR is at a high level and the bit line is in a precharge state.

As described above, when the /RAS terminal is turned at a low level, the LH terminal of the first delay (D) bistable circuit 23 is turned at a low level and is turned in a load state (in a data receive state). The internal clock pulse CLKC is input to the CLK terminal in phase. The output of the second delay (D) bistable circuit 30 is turned at a high level at a leading edge of the internal clock pulse CLKC, an IRAS reset signal RSTP is turned at a low level and a reset state of the first delay (D) bistable circuit 23 is released. Afterward, the internal clock pulse which is kept at a high level when it is input to the D terminal is output to the Q terminal of the first delay (D) bistable circuit 23. The internal operation timing control clock pulse IRAS is turned at a high level by delaying by time τ1 determined by the first delay element by the first delay element 24 and the second AND element 25.

When the internal operation timing control clock pulse IRAS is turned at a high level, the R terminal of the sixth SR bistable circuit 66 is turned at a high level in the row control circuit 102 and the clock pulse at a low level is output from the Q terminal. The bit line precharge signal EQPR is turned at a low level and the precharge of the bit line is released. The word line block activation signal XBK is turned at a high level. Hereby, a predetermined word line WL is activated and as a result, minute potential difference is caused between the predetermined number of memory cells connected the word line WL and each bit line pair BL, /BL connected to each memory cell.

Afterward, the sense amplifier activation signal SE is turned at a high level in time τ2 determined by the eleventh delay element 61 in the row control circuit 102 and a sense amplifier in the sense amplifier sequence 12 is activated. The time τ2 is a period required for applying minute potential difference between each bit line pair BL, /BL and each memory cell to the sensitivity of the sense amplifier.

When the sense amplifier is activated, potential difference read by each bit line pair BL,/BL is amplified.

Next, in normal read operation and write operation as shown in FIG. 6, the /RAS terminal is turned at a high level and the /CAS terminal is turned at a low level by the next leading edge of the clock pulse CLK. In read operation, the /WE terminal is turned at a high level. Hereby, column operation is executed. The timing of one clock cycle in which the /RAS terminal is at a high level, the /CAS terminal is at a low level and the /WE terminal is at a high level at a leading edge of the clock. pulse CLK is called CAS read timing.

The internal column address strobe pulse CAS is turned at a high level, the internal write enable signal WE is turned at a low level and the output of the third NAND element 38 is turned at a low level. Data at each D terminal in the fifth delay (D) bistable circuit 300 and the sixth delay (D) bistable circuit 301 is fetched at a leading edge of the internal clock pulse CLKC and respective NQ terminals are turned at a high level. The output of the fifth D flip-flop 300 is input to the one-shot circuit 302 and the reading control signal REN becomes a one-shot pulse in time τ3 determined in the one-shot circuit 302. The read operation flag RENF which is the output of the sixth D flip-flop 301 is turned at a high level.

When the reading control signal REN is turned at a high level, the output of the fourth NOR element 520 is turned at a low level, the output of the fourth NAND element is turned at a high level, and the column operation flag YEN, the main data line precharge signal /PRM and the column connection enable signal YPAEN are turned at a high level. When the main data line precharge signal /PRM is turned at a high level, the main data line precharge circuit 76 is inactivated and the precharge of a main data line MBL connecting a read amplifier and a sense amplifier is released. Also, when the column connection enable signal YPAEN is turned at a high level, a predetermined read amplifier 72 and a predetermined main data line MBL are connected according to a column address signal CA output by the column address latch circuit 16.

In the meantime, the second SR bistable circuit 57 is turned active and outputs a high level by the output of the third one-shot circuit 56 to which the reading control signal REN is input. Therefore, a sense amplifier selection enable signal /MBTEN output from the second NOR element 58 is turned at a low level.

When the sense amplifier selection enable signal /MBTEN is turned at a low level, the selected predetermined main data line MBL and the selected predetermined sense amplifier are connected. When they are connected, potential difference is caused between activated each sense amplifier and each main data line MBL. The sense amplifier selection enable signal /MBTEN is transmitted in the sense amplifier sequence 12 and after the predetermined sense amplifier and main data line MBL are connected, the signal is returned to the column control circuit 103.

The third SR bistable circuit 501 is turned active by the returned sense amplifier selection enable signal /MBTEN and a high level is output. Then, the read amplifier activation signal /MSE is turned at a high Level in delay time determined by the ninth delay element 512. The delay time determined by the ninth delay element 512 means a period in which data in each sense amplifier is read onto each main data line MBL up to electric potential which can be read by a read amplifier.

The read amplifier activation signal /MSE is turned at a high level, a read amplifier 72 in the read/write amplifier column decoder sequence 15 is activated and data is read. The read amplifier activation signal /MSE is transmitted in the read/write amplifier column decoder sequence 15 and after all read amplifiers are activated, the signal is returned to the column control circuit 103.

Also, when the third SR bistable circuit 501 is turned active, the output data latch signal DLCH1 is turned at a low level, the latch of the second group of data latch circuits 74 is released and the hold of data is finished. As the output data latch signal DLCHA is at a low level at this time, the first group of data latch circuits 73 is inactive and data is output from a read amplifier. The latch of the second group of data latch circuits 74 which receives the data is released and read data is output to the data output circuit 17 via internal DO. When an output enable signal OE is turned at a high level, data is output to the data output terminal DO.

After a period determined by the tenth delay element 515 according to the read amplifier activation signal /MSE returned to the column control circuit 103, the output data latch signal DLCHA is turned at a high level and data in a read amplifier is latched in the first group of data latch circuits 73. The output data latch signal DLCHA is transmitted in the read/write amplifier column decoder sequence 15 and after all data latch circuits in the first group of data latch circuits 73 are turned in a latch state, the signal is returned to the column control circuit 103.

The output data latch signal DLCH1 is turned at a high level by the output data latch signal DLCHA returned to the column control circuit 103. Data latched by the first group of data latch circuits 73 is latched by the second group of data latch circuits 74 and output data is held. The output data latch signal DLCH1 is transmitted in the read/write amplifier column decoder sequence 15 and after all data latch circuits in the second group of data latch circuits 74 are turned in a latch state, the signal is returned to the column control circuit 103.

When the output data latch signal DLCH1 is returned to the column control circuit 103, column operation is finished, and the column operation flag YEN, the main data line precharge signal /PRM and the column connection enable signal YPAEN are respectively turned at a low level by the thirteenth inverter element 519, the fourth NOR element 520 and the fourth NAND element 522. Then, the main data line precharge circuit 76 is activated, the precharge of a main data line MBL connecting a read amplifier and a sense amplifier is started and the selection of a read amplifier and a sense amplifier is released.

When the column operation flag YEN is turned at a high level, a pulse signal at a high level is applied to the output terminal of the first NOR element 28 during a period determined by the third delay element 29 after time τ4 determined by the second delay element 26. As the signal is also input to the reset terminal of the first delay (D) bistable circuit 23, the internal operation timing control clock pulse IRAS is turned at a low level.

When the internal operation timing control clock pulse IRAS is turned at a low level, row operation is finished as follows. First, the S terminal of the fourth SR bistable circuit 66 is turned at a high level after a period τ5 determined by the twelfth delay element 63 and the Q terminal of the fourth SR bistable circuit 66 is turned at a high level. Therefore, the word line block activation signal XBK is turned at a low level, the word line WL is turned at a low level and rewrite operation in a memory cell is finished. Also, the sense amplifier activation signal SE is turned at a low level and the sense amplifier is inactivated. Also, the bit line precharge signal EQPR is turned at a high level, the bit line pair BL and /BL is turned in a precharge state and the next operation gets ready.

At the next leading edge of the clock pulse, the read operation flag RENF is turned at a low level.

Next, referring to FIGS. 1 to 9, write operation will be described.

As in read operation, at a leading edge of the clock pulse CLK, RAS timing for turning the /RAS terminal at a low level and turning the /CAS terminal at a high level is input and the selection of a row address including the selection of a word line WL is performed. As this timing is similar to that in read operation, the description is omitted.

Next, as shown in FIG. 9, the /RAS terminal is turned at a high level and the /CAS terminal is turned at a low level respectively by the next leading edge of the clock pulse. The /WE terminal is turned at a low level in write operation. Hereby, column operation is executed. The timing of one clock cycle in which the /RAS terminal is at a high level, the /CAS terminal is at a low level and the /WE terminal is at a low level respectively at a leading edge of this clock pulse CLK is CAS write timing.

The internal column address strobe pulse CAS and the internal write enable signal WE are turned at a high level and the output of the second NAND element 35 is turned at a low level. Data at each D terminal of the third delay (D) bistable circuit 36 and the fourth delay (D) bistable circuit 337 is fetched respectively at a leading edge of the internal clock pulse CLK and a high level is output to respective NQ terminals. The output of the third delay (D) bistable circuit 36 is input to the one-shot circuit 303 and the writing control signal WEN becomes one-shot pulse in time τ6 determined by the one-shot circuit 303. The write operation flag WENF which is the output of the fourth delay (D) bistable circuit 37 is turned at a high level.

When the writing control signal WEN is turned at a high level, the fourth SR bistable circuit 503 is turned active, the output of the fourth NAND element 522 is turned at a high level, and the column operation flag YEN, the main data line precharge signal /PRM and the column connection enable signal YPAEN are turned at a high level. As the write operation flag WENF is also turned at a high level, the write amplifier activation signal WECON is also turned at a high level.

When the main data line precharge signal /PRM is turned at a high level, the main data line precharge circuit 76 is inactivated and the precharge of the main data line MBL connecting a write amplifier and a sense amplifier is released. Also, when the column connection enable signal YPAEN is turned at a high level, a predetermined write amplifier 75 and a predetermined main data line MBL are selected by the column decoder 71 based upon a column address signal CA output by the column address latch circuit 16.

Also, a predetermined write amplifier 75 determined based upon the column address signal CADD in the read/write amplifier column decoder sequence 15 is activated and data included in the data input signal DI is output to the predetermined main data line MBL connected to the predetermined write amplifier 75.

Also, when the writing control signal WEN is turned at a high level, the first SR bistable circuit 51 is turned active after time τ7 determined by the sixth delay element 50 and a high level is output to the Q terminal. Hereby, the sense amplifier selection enable signal /MBTEN is turned at a high level, and the main data line MBL and a group of sense amplifiers are connected. The delay time determined by the sixth delay element 50 shall be a period until data in an activated predetermined write amplifier 75 is completely output to the main data line MBL.

The sense amplifier selection enable signal /MBTEN is transmitted in the sense amplifier sequence 12 and after a predetermined sense amplifier and the main data line MBL are connected, the signal is returned to the column control circuit 103.

The first SR bistable circuit 51 and the fourth SR bistable circuit 503 are reset by the returned sense amplifier selection enable signal /MBTEN. After the reset, the output of the third OR element 55 is turned at a low level after time determined by the seventh delay element 52 and the eighth delay element 54. Hereby, the sense amplifier selection enable signal /MBTEN is turned at a high level.

Hereby, the output of the fifth AND element 505 is turned at a low level, the output of the third NOR element 504 is turned at a high level, and the column operation flag YEN, the main data line precharge signal /PRM, the column connection enable signal YPAEN and the write amplifier activation signal WECON are turned at a low level. Hereby, the precharge of the main data line MBL connecting a write amplifier 75 and a sense amplifier is started, the selection of the write amplifier and the sense amplifier is released, further, the write amplifier 75 is turned inactive and column operation is finished.

When the column operation flag YEN is turned at a high level, a pulse signal at a high level is output to the output terminal of the first NOR element 28 after the period τ4 determined by the third delay element 29 after time determined by the second delay element 26. As the signal is input to the reset terminal of the first delay (D) bistable circuit 23, the internal operation timing control clock pulse IRAS is turned at a low level.

When the internal operation timing control clock pulse IRAS is turned at a low level, row operation is finished as follows. First, the S terminal of the fourth SR bistable circuit 66 is turned at a high level after the period τ5 determined by the twelfth delay element 63 and the Q terminal of the fourth SR bistable circuit 66 is turned at a high level. Therefore, the word line block activation signal XBK is turned at a low level, the work line WL is turned at a low level and rewrite operation to a memory cell is finished. The sense amplifier activation signal SE is turned at a low level and the sense amplifier is turned inactive. Also, the bit line precharge signal EQPR is turned at a high level, the bit line pair BL and /BL is turned in a precharge state and the next operation gets ready.

In the meantime, to realize a page mode, in CAS read timing or CAS write timing, if the /RAS terminal is kept at a low level, the first delay (D) bistable circuit 23 is not reset, the internal operation timing control clock pulse IRAS is not turned at a low level, therefore, the sense amplifier activation signal SE is kept at a high level, the word line block activation signal XBK is kept at a high level and the word line WL is kept in the selected state. CAS read timing or CAS write timing is enabled to be continued and a page mode can be realized.

As described above, according to this embodiment, the read operation and the write operation of the DRAM are enabled by latching the row address signal RADD at the first leading edge of the clock pulse CLK and latching the column address signal CADD at the second leading edge.

Also, a margin in which the bit line pair BL and /BL is precharged is acquired by turning the internal operation timing control clock pulse IRAS at a high level after predetermined delay time determined by the first delay element 24 since the first leading edge of the clock pulse CLK.

Also, when column operation is started at the second leading edge of the clock pulse CLK, the column operation flag YEN is turned at a high level. In read operation, in a period from the connection of a sense amplifier and the main data line to the activation of the main amplifier, in a period from the activation of the main amplifier to the latch of data and in a period from the termination of the latch of data to turning the column operation flag YEN at a low level, the timing of each operation is defined by returning the control signal to the column control circuit 103. Also, in write operation, a period from the activation of a write amplifier to the connection of a sense amplifier and the main data line is defined as the period determined by the sixth delay element 50 and a period from the connection of the main data line to turning the column operation flag YEN at a low level is defined by returning the control signal to the column control circuit 103. Timing that the internal operation timing control clock pulse IRAS is turned at a low level, row operation is finished and the bit line pair BL and /BL is precharged is acquired by turning the column operation flag YEN for defining column operation at a low level.

Further, a page mode operation is realized by keeping the /RAS terminal at a low level at the second leading edge of the clock pulse CLK and never turning the internal operation timing control clock pulse IRAS at a low level even if the column operation flag YEN is turned at a low level.

Therefore, the semiconductor memory in this embodiment can complete read operation and write operation in two clock cycles. Therefore, even if the clock frequency of the whole system is reduced, the data transfer rate is not deteriorated. The system design is facilitated by reducing the clock frequency of the system and the power consumption can be also reduced.

Figure 10:
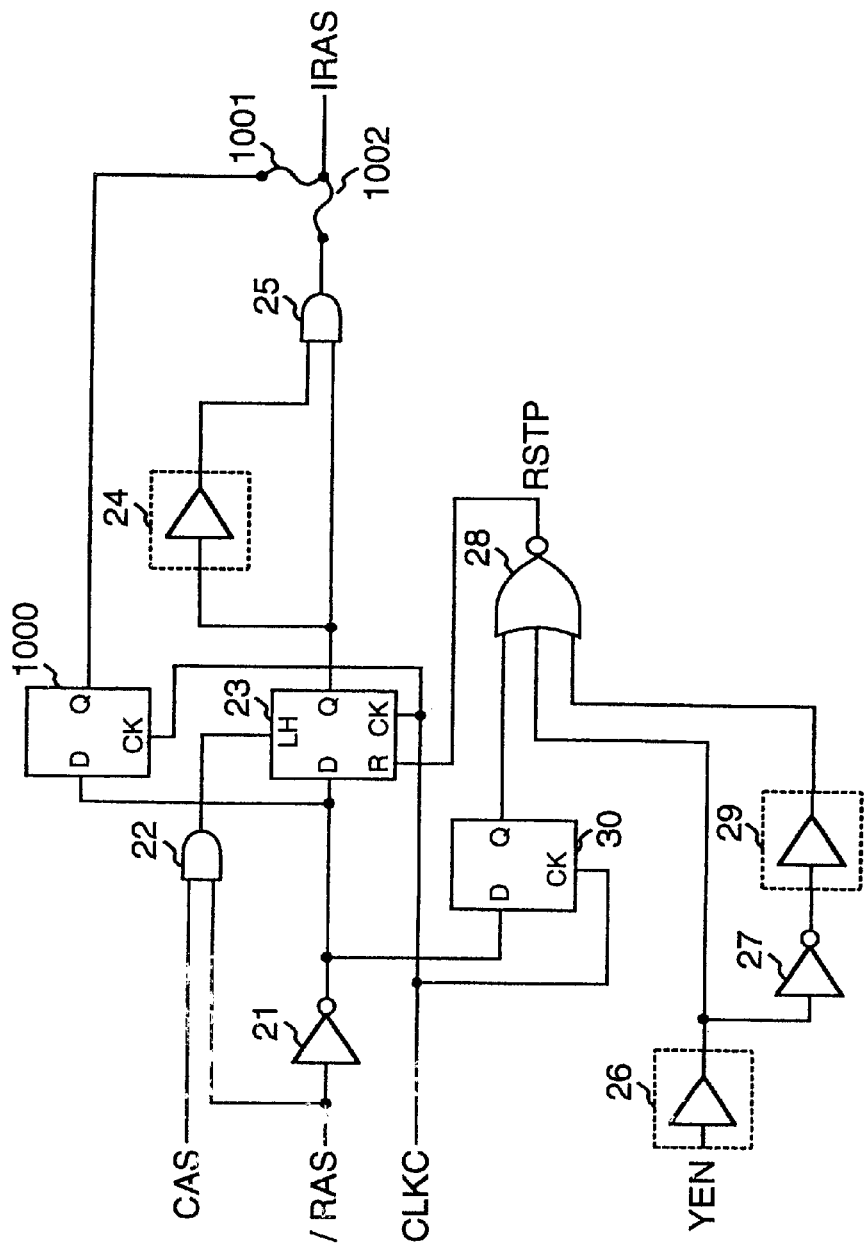
FIG. 10 is a circuit diagram showing a timing control circuit in a semiconductor memory equivalent to a second embodiment of the invention.
Figure 11A:
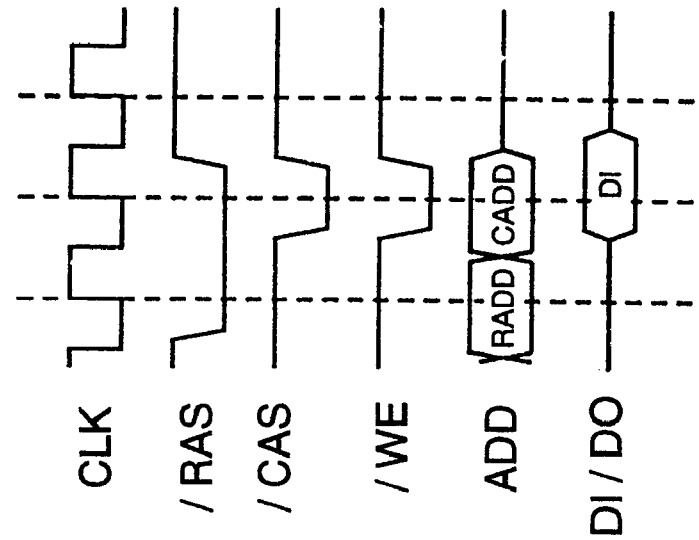
FIGS. 11A and 11B are timing charts showing write operation and read operation in a conventional type semiconductor memory.
Figure 11B:
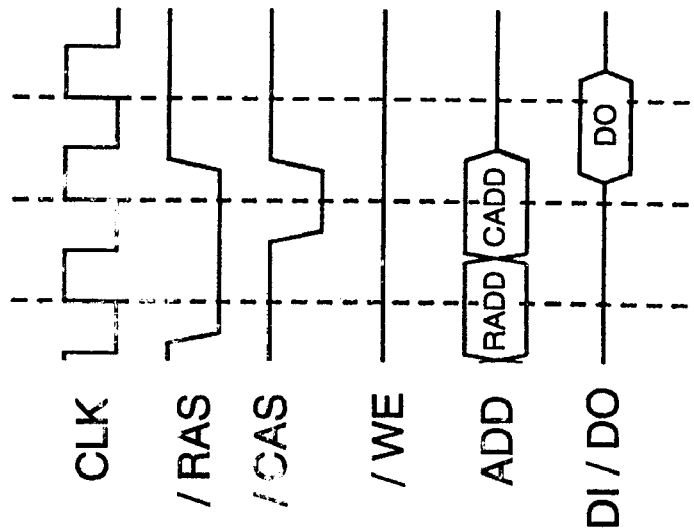

FIG. 10 is a circuit diagram showing a timing control circuit 100 in a second embodiment of the invention. As a group of elements denoted by reference numbers 21 to 30 in FIG. 10 is similar to that shown in FIG. 2 in the configuration and the connected state, the description is omitted. The group of elements is different from that shown in FIG. 2 in that in FIG. 10, a seventh delay (D) bistable circuit 1000, a first fuse element 1001 and a second fuse element 1002 are provided.

The output of a second AND element 25 is sent to an internal operation timing control clock IRAS via the second fuse element 1002. The seventh delay (D) bistable circuit 1000 is a D flip-flop of a synchronous type with a clock, the output of a first inverter element 21 is input, an internal clock pulse CLKC is input to its clock terminal and the output is input to the first fuse element 1001. The other terminal of the first fuse element 1001 is connected to the internal operation timing control clock IRAS.

Either of the first or second fuse element 1001 or 1002 is disconnected if necessary in a laser repair process for the relief of redundancy and others.

The operation of the semiconductor memory configured as described above will be described below.

When the second fuse element 1002 is disconnected, the timing in conventional embodiments can be realized for the timing of read operation and write operation. When the /RAS terminal is turned at a low level and the clock terminal CLK is turned at a high level, the internal operation timing control clock pulse IRAS is immediately turned at a high level and a sense amplifier is activated. When the /RAS terminal is turned at a high level and the clock terminal CLK is turned at a high level, the internal operation timing control clock pulse IRAS is turned at a low level and bit line precharge operation is started.

Also, when the first fuse element 1001 is disconnected, the operation in two clock cycles such as described in the first embodiment for the timing of read operation and write operation can be realized.

The frequency of the operation clock of the semiconductor memory according to the invention can be varied if necessary by configured as described above. Therefore, the semiconductor memory corresponding to a system of a wide frequency can be provided.

It may be also determined depending upon which of plural mask patterns used in a lithographic process for manufacturing semiconductor is used which of the first fuse element 1001 and the second fuse element 1002 is formed and it may be also realized by defining a connected state which of the first fuse element 1001 and the second fuse element 1002 is connected.

In the first embodiment, timing for synchronizing with the clock pulse is a leading edge, however, a trailing edge may be also used.

As described above, in the semiconductor memory according to the invention, a signal which is turned at a low level when column operation is started and which is turned at a high level when the column operation is finished is provided, the precharge operation of the bit line is started after a predetermined period since the signal is turned at a low level, the delay elements are provided for row operation, a period for the precharge operation of the bit line is acquired by delaying the start of row operation and normal operation in two clock cycles is enabled. As the required number of clocks is reduced in relation to reading and writing data, the power consumption can be reduced. Therefore, operation at a low frequency is enabled without deteriorating a data transfer rate.

Also, the system using the semiconductor memory according to the invention can be easily designed by using a clock having a low frequency.

What is claimed is:

1. A semiconductor memory device comprising:
    a memory cell array including plural memory cells;
    plural word lines selected by a row address signal from an external device;
    plural bit lines selectively activated by a column address signal from the external device;
    a sense amplifier for amplifying data read from the plural bit lines;
    row address latch means for latching a row address signal corresponding to the activated state of a first control signal triggered by a first edge of a clock pulse;
    an internal circuit for determining the lapse of a predetermined period of time after the first edge of the clock pulse;
    sense amplifier activation means for activating the sense amplifier according to the activated state of the first control signal after a lapse of a first delay time triggered by the first edge of the clock pulse;
    column address latching means for latching the column address signal according to the activated state of a second control signal triggered by a second edge of the clock pulse succeeding the first edge of the clock pulse; and
    precharge signal generation means for generating a precharge signal for precharging the bit lines according to the activated state of the second control signal after a lapse of a second delay time triggered by the second edge of the clock pulse.

2. A semiconductor memory according to claim 1, further comprising:
    a first internal clock generator for turning an internal clock in a predetermined state after a predetermined period elapses since the first edge corresponding to the activated state of a first control signal triggering the first edge of the internal clock for activating the sense amplifier and the clock pulse; and
    a second internal clock generator for latching the first control signal in synchronization with the clock pulse, wherein the first internal clock generator is connected to the internal clock via a first fuse element and the second internal clock generator is connected to the internal clock via a second fuse element; and
    the first fuse element or the second fuse element can be disconnected if necessary during the manufacturing process or after the manufacture.

3. A semiconductor memory according to claim 2, wherein the connected state of the first fuse element or the second fuse element is determined by the option of a lithographic mask used in a wiring process.

4. A semiconductor memory device according to claim 1, further comprising:

control means for determining the state of a writing control signal, wherein, when triggered by the second edge of the clock signal, the control means permits a write operation when the writing control signal is in a first state and the control means permits a read operation when the writing control signal is in a second state different from the first state, and further wherein the first and second edges of the clock pulse are an edge when the clock pulse proceeds from a first level to a second level, and still further wherein the clock pulse and the first and second control signals are input from an external device.

5. A semiconductor memory device according to claim 1, further comprising:

timing control means, triggered by the second edge of the clock pulse, to determine the state of the first control signal, wherein, if the first control signal is determined to be in a first state, the timing control means inhibits page mode operation and permits a precharge for the bit line to get ready for the next operation during the clock cycle including the second edge, and further wherein, if the first control signal is determined to be in a second state different than the first state, the timing control means permits page mode operation and inhibits the precharge for the bit line during the clock cycle including the second edge.

6. A semiconductor memory device according to claim 1, further comprising:

means for setting a third control signal to a first state when triggered by the second edge of the clock signal; and means for setting the third control signal to a second state different from the first state when a read or a write operation is completed, wherein the precharging of the bit line is started a predetermined period of time after the third control signal is set to the second state, and further wherein the first and second edges of the clock pulse are an edge when the clock pulse proceeds from a first level to a second level.

7. A semiconductor memory device according to claim 6, further comprising:

plural read/write amplifiers arranged between the sense amplifier and a data input-output circuit for reading and writing data from the sense amplifier, a data input-output circuit for reading and writing data from the sense amplifier;

a column control circuit for controlling the read/write amplifier, wherein the column control circuit, when triggered by the second edge of the clock pulse, generates a read/write amplifier control signal for controlling the operation of the read/write amplifier when the second control signal is in the activated state, and further wherein the read/write amplifier control signal is returned to the column control circuit via a read/write amplifier which receives the signal from the last of the plural read/write amplifiers, and even further wherein the third control signal is set to the second state according to the read/write amplifier control signal returned to the column control circuit.

8. A semiconductor memory device according to claim 1, further comprising:

an internal clock;

a first internal clock generator for setting the internal clock to a predetermined state during the activated state of the first control signal and after the lapse of the predetermined period of time;

a second internal clock generator for latching the first control signal in synchronization with the clock pulse;

a first fuse element for connecting the first internal clock generator to the internal clock, wherein the first fuse element can be disconnected during or after manufacture; and a second fuse element for connecting the second internal clock generator to the internal clock; wherein the second fuse element can be disconnected during or after manufacture.

9. A semiconductor memory device according to claim 8, wherein the connected state of the first fuse element is determined by using a lithographic mask in a manufacturing process, and further wherein the connected state of the second fuse element is also determined by using a lithographic mask in a manufacturing process.

* * * * *

UNITED STATES PATENT AND TRADEMARK OFFICE
CERTIFICATE OF CORRECTION

PATENT NO. : 6,349,072 B1
DATED : February 19, 2002
INVENTOR(S) : Kenichi Origasa, Kiyoto Oota and Tomonori Fujimoto It is certified that error appears in the above-identified patent and that said Letters Patent is hereby corrected as shown below:

Column 1,
Line 23, please delete "on", and insert therefor -- of --.
Line 25, please delete "i s", and insert therefor -- is --.

Column 2,
Line 39, please delete "Line", and insert therefor -- line --.

Column 5,
Line 41, please delete "Liming", and insert therefor -- timing --.

Column 7,
Line 24, after the second occurrence of "fifth", please delete -- , -- (comma).

Column 10,
Line 26, please delete "DLCHA", and insert therefor -- DLCH1 --.

Column 13,
Line 38, please delete "Level", and insert therefor -- level --.

Column 15,
Line 5, please delete "337", and insert therefor -- 37 --.

Column 19,
Line 33, please delete "bit line", and insert therefor -- bitline --.

Signed and Sealed this

Twenty-fourth Day of September, 2002

*Attest:*

*Attesting Officer*

JAMES E. ROGAN
*Director of the United States Patent and Trademark Office*